US010141360B2

United States Patent
Leung et al.

(10) Patent No.: US 10,141,360 B2
(45) Date of Patent: Nov. 27, 2018

(54) ISOLATED GLOBAL SHUTTER PIXEL STORAGE STRUCTURE

(71) Applicant: OMNIVISION TECHNOLOGIES, INC., Santa Clara, CA (US)

(72) Inventors: Kevin Ka Kei Leung, San Jose, CA (US); Dajiang Yang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 147 days.

(21) Appl. No.: 15/280,775

(22) Filed: Sep. 29, 2016

(65) Prior Publication Data

US 2017/0018583 A1    Jan. 19, 2017

Related U.S. Application Data

(62) Division of application No. 14/524,791, filed on Oct. 27, 2014, now Pat. No. 9,484,370.

(51) Int. Cl.
*H01L 27/146* (2006.01)
*H04N 5/374* (2011.01)
*H04N 5/378* (2011.01)

(52) U.S. Cl.
CPC .... *H01L 27/1463* (2013.01); *H01L 27/14605* (2013.01); *H01L 27/14609* (2013.01);
(Continued)

(58) Field of Classification Search
CPC ......... H01L 27/14818; H01L 27/14612; H01L 27/1464; H01L 27/14689; H01L 27/14623
See application file for complete search history.

(56) References Cited

U.S. PATENT DOCUMENTS 7,285,433 B2    10/2007    Kretchmer et al.
7,800,192 B2    9/2010    Venezia et al.
(Continued)

OTHER PUBLICATIONS

Luo, S. H. et al., "Buried tungsten silicide layer in silicon on insulator substrate by Smart-Cut®," Institute of Physics Publishing, Semiconductor Science and Technology, vol. 19, No. 11, Sep. 2004, IOP Publishing Ltd, United Kingdom, pp. 1329-1332.
(Continued)

*Primary Examiner* — Brigitte Paterson
(74) *Attorney, Agent, or Firm* — Christensen O'Connor; Johnson Kindness PLLC

(57) ABSTRACT

An imaging system includes a pixel array of pixel cells with each one of the pixel cells including a photodiode disposed in a semiconductor material, a global shutter gate transistor, disposed in the semiconductor material and coupled to the photodiode, a storage transistor disposed in the semiconductor material, an optical isolation structure disposed in the semiconductor material to isolate a sidewall of the storage transistor from stray light and stray charge. The optical isolation structure also includes a deep trench isolation structure that is filled with tungsten and a P+ passivation formed over an interior sidewall of the deep trench optical isolation structure. Each one of the pixel cells also include control circuitry coupled to the pixel array to control operation of the pixel array and readout circuitry coupled to the pixel array to readout image data from the plurality of pixels.

11 Claims, 3 Drawing Sheets

(52) U.S. Cl.
CPC .. *H01L 27/14614* (2013.01); *H01L 27/14623* (2013.01); *H01L 27/14641* (2013.01); *H01L 27/14643* (2013.01); *H01L 27/14656* (2013.01); *H01L 27/14685* (2013.01); *H01L 27/14689* (2013.01); *H04N 5/374* (2013.01); *H04N 5/378* (2013.01)

(56) References Cited

U.S. PATENT DOCUMENTS

| | | | |
|---|---|---|---|
| 8,076,170 | B2 | 12/2011 | Brady |
| 8,089,036 | B2 | 1/2012 | Manabe |
| 8,187,909 | B2 | 5/2012 | Venezia et al. |
| 8,294,203 | B2 | 10/2012 | Van Noort et al. |
| 8,507,962 | B2 | 8/2013 | Anderson et al. |
| 8,575,531 | B2 | 11/2013 | Hynecek et al. |
| 8,835,211 | B1 * | 9/2014 | Chen ............... H01L 27/14806 257/225 |
| 8,933,494 | B1 | 1/2015 | Hu et al. |
| 2005/0101100 | A1 * | 5/2005 | Kretchmer ........ H01L 21/76224 438/424 |
| 2009/0201400 | A1 | 8/2009 | Zhang et al. |
| 2012/0273854 | A1 | 11/2012 | Velichko et al. |
| 2013/0164877 | A1 | 6/2013 | Anderson et al. |
| 2014/0103411 | A1 | 4/2014 | Dai et al. |
| 2014/0131779 | A1 | 5/2014 | Takeda |
| 2016/0118438 | A1 | 4/2016 | Leung et al. |

OTHER PUBLICATIONS

Park, B. J. et al., "Deep Trench Isolation for Crosstalk Suppression in Active Pixel Sensors with 1.7 μm Pixel Pitch," Japanese Journal of Applied Physics, vol. 46, No. 4B, Apr. 2007, pp. 2454-2457.

Tournier, A. et al., "Pixel-to-Pixel Isolation by Deep Trench Technology: Application to CMOS Image Sensor," Proc. IISW, 2011, pp. 12-15.

"Global Shutter Pixel Technologies and CMOS Image Sensors—A Powerful Combination," An Aptina™ Technology White Paper, ©2012 Aptina Imaging Corporation, 5 pages. Retrieved from: http://www.aptina.com/products/technology/Aptina_Global-Shutter-WhitePaper.pdf.

Kitamura, Y. et al., "Suppression of Crosstalk by Using Backside Deep Trench Isolation for 1.12μm Backside Illuminated CMOS Image Sensor," Electron Devices Meeting (IEDM), Dec. 10-13, 2012, San Francisco, 2012 IEEE International, pp. 24.2.1-24.2.4.

Ahn, J. et al., "A 1/4-inch 8Mpixel CMOS Image Sensor with 3D Backside-Illuminated 1.12μm Pixel with Front-Side Deep-Trench Isolation and Vertical Transfer Gate," ISSCC 2014: Session 7: Image Sensors: 7.1, 2014 IEEE International Solid-State Circuits Conference, Digest of Technical Papers, pp. 124-126.

ROC (Taiwan) Patent Application No. 104135128—Taiwanese Office Action and Search Report, with English Translation, dated Jun. 8, 2016, 12 pages.

PRC (China) Pat. Application No. 201510700902.0—Chinese Office Action with English Translation dated Dec. 15, 2018, 18 pages.

ROC (Taiwan) Patent Application No. 105141095—Taiwanese Office Action and Search Report, with English Translation, dated Sep. 30, 2017, 10 pages.

* cited by examiner

ISOLATED GLOBAL SHUTTER PIXEL STORAGE STRUCTURE

CROSS-REFERENCE TO RELATED APPLICATIONS

This application is a division of U.S. patent application Ser. No. 14/524,791, filed on Oct. 27, 2014, now pending. U.S. patent application Ser. No. 14/524,791 is hereby incorporated by reference.

BACKGROUND INFORMATION

Field of the Disclosure

The present invention relates generally semiconductor processing. More specifically, examples of the present invention are related to semiconductor processing of image sensor pixel cells having global shutters.

Background

For high-speed image sensors, a global shutter can be used to capture fast-moving objects. A global shutter typically enables all pixel cells in the image sensor to simultaneously capture the image. For slower moving objects, the more common rolling shutter is used. A rolling shutter normally captures the image in a sequence. For example, each row within a two-dimensional ("2D") pixel cell array may be enabled sequentially, such that each pixel cell within a single row captures the image at the same time, but each row is enabled in a rolling sequence. As such, each row of pixel cells captures the image during a different image acquisition window. For slow moving objects, the time differential between each row can generate image distortion. For fast-moving objects, a rolling shutter can cause a perceptible elongation distortion along the object's axis of movement.

To implement a global shutter, storage capacitors or storage transistors can be used to temporarily store the image charge acquired by each pixel cell in the array while it awaits readout from the pixel cell array. When a global shutter is used, a transfer transistor is typically used to transfer image charge from the photodiode to the storage transistor, and then an output transistor is used to transfer the stored image charge from the storage transistor to a readout node of the pixel cell. Factors that affect performance in an image sensor pixel cell having a global shutter include global shutter efficiency, dark current, white pixels, and image lag. In general, global shutter pixel performance improves as global shutter efficiency improves. Global shutter efficiency is a measure of how well signal charge can be stored in the storage node without being contaminated by parasitic light and/or electrical crosstalk.

BRIEF DESCRIPTION OF THE DRAWINGS

Non-limiting and non-exhaustive examples of the present invention are described with reference to the following figures, wherein like reference numerals refer to like parts throughout the various views unless otherwise specified.

Figure 1:
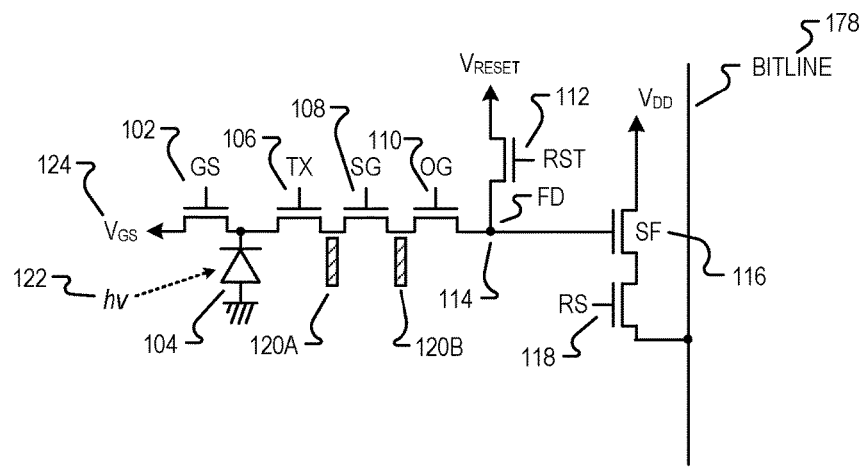
FIG. 1 is a schematic illustrating one example of a pixel cell including an isolated global pixel storage structure in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

As will be shown, methods and apparatuses directed to isolated global shutter pixel storage structures are disclosed. In the following description, numerous specific details are set forth in order to provide a thorough understanding of the present invention. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," an embodiment, "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. The following is a detailed description of the terms and elements used in the description of examples of the present invention by referring to the accompanying drawings.

As will be shown, a global shutter pixel cell including a storage transistor surrounded by one or more deep trench optical isolation structures filled with tungsten is disclosed. As will be discussed in further detail below, the tungsten filled deep trench optical isolation structures isolate the sidewalls of the storage transistor of the global shutter pixel cell from parasitic stray light and/or stray charge from entering the storage transistor. Thus, global shutter efficiency is improved because image charge stored in the storage transistor is isolated from contamination by parasitic stray light, which reduces electron hole pairs from being generated in the storage transistor as a result of the parasitic stray light. In addition, stray charge is prevented from entering the storage transistor, which reduces deep silicon electrical crosstalk in accordance with the teachings of the present invention.

To illustrate, FIG. 1 is a schematic illustrating one example of a pixel cell 100 with a global shutter and an isolated global shutter pixel storage structure in accordance with the teachings of the present invention. In the example, pixel cell 100 may be one of a plurality of pixel cells in a pixel array. As shown in the depicted example, pixel cell 100 includes a global shutter gate transistor 102, a photodiode 104, a transfer transistor 106, a storage transistor 108, an output transistor 110, a readout node 114, a reset transistor 112, an amplifier transistor 116, and a row select transistor 118 coupled to a bitline 178. In one example, the readout node 114 is a floating diffusion disposed in the semiconductor material of pixel cell 100. In one example, the amplifier transistor 116 is implemented with a source follower coupled transistor. As shown in the example of FIG. 1, global shutter gate transistor 102 is coupled between a $V_{GS}$ voltage and the photodiode 104.

In operation, the global shutter gate transistor is coupled to selectively deplete the image charge that has accumulated in the photodiode 104 by selectively coupling the photodiode 104 to voltage $V_{GS}$ in response to a global shutter signal GS. The photodiode 104 is disposed in the semiconductor material pixel cell 100 to accumulate image charge in response to incident light 122 directed to the photodiode 104. In one example, the incident light 122 may be directed through a front side of the semiconductor material of pixel cell 100. In another example, it is appreciated that the incident light 122 may be directed through a backside of the semiconductor material of pixel cell 100. The image charge has accumulated in photodiode 104 is coupled to be transferred to an input of the storage transistor 108 through transfer transistor 106.

In the depicted example, the storage transistor 108 is illustrated as being isolated in the semiconductor material of pixel cell 100 by a first optical isolation structure 120A and second optical isolation structure 120B. As will be discussed in further detail below, in one example, first and second optical isolation structures 120A and 120B are optically opaque optical isolation structures that block parasitic stray light and/or stray charge from entering storage transistor 108 from the surrounding area of storage transistor 108 to improve global shutter efficiency in accordance with the teachings of the present invention.

The example in FIG. 1 also illustrates that output transistor 110 is coupled to an output of the storage transistor 108 to selectively transfer the image charge from the storage transistor 108 to readout node 114, which in the illustrated example is a floating diffusion FD. A reset transistor 112 is coupled between a reset voltage $V_{RESET}$ and the readout node 114 to selectively reset the charge in the readout node 114 in response to a reset signal RST. In the example, amplifier transistor 116 includes an amplifier gate coupled to the readout node 114 to amplify the signal on readout node 114 to output image data from pixel cell 100. Row select transistor 118 is coupled between bitline 178 and the amplifier transistor 116 to output the image data to bitline 178.

Figure 2:
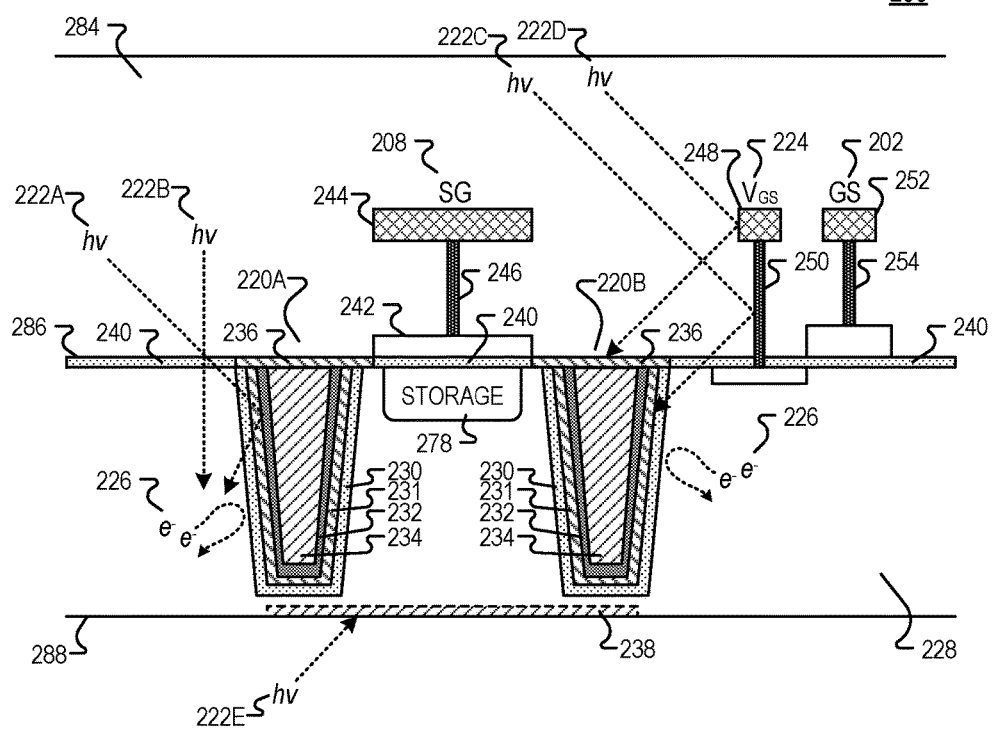
FIG. 2 is a cross-section view illustrating a portion of one example of a pixel cell including an isolated global pixel storage structure in accordance with the teachings of the present invention.

FIG. 2 is a cross-section view illustrating a portion of one example of a pixel cell 200 including an isolated global pixel storage structure in accordance with the teachings of the present invention. In the example, pixel cell 200 may be one of a plurality of pixel cells in a pixel array. It is noted that pixel cell 200 of FIG. 2 in one example is a cross-section view of a portion of pixel cell 100 of FIG. 1, and that similarly named and numbered elements referenced below are coupled and function similar to as described above. It is appreciated that the cross-section illustration of FIG. 2 does not intersect each and every element shown in FIG. 1, and that therefore some elements illustrated in FIG. 1, although present in pixel cell 200, may not be visible in the cross-section illustration of FIG. 2.

The example illustrated in FIG. 2 shows that pixel cell 200 includes a storage transistor 208 disposed in semiconductor material 228. In the example, storage transistor 208 includes a storage region 278 to store image charge that is accumulated by a photodiode (e.g., photodiode 104) disposed in semiconductor material 228 in response to incident light directed to the photodiode. In one example, semiconductor material 228 may include silicon, and storage region 278 may be storage diode of storage transistor 208 that is formed with doped silicon in the semiconductor material 228 under a storage gate 242, with a gate oxide 240 disposed between the storage gate 242 and the storage region 278.

The example shown in FIG. 2 shows that pixel cell 200 also includes other surrounding elements disposed in semiconductor material 228 outside of storage transistor 208. For instance, a global shutter gate transistor 202 is illustrated being disposed in semiconductor material 228. In the example, global shutter gate transistor 202 may be used to selectively deplete image charge from a photodiode also disposed in semiconductor material 228 by coupling voltage $V_{GS}$ 224 to the photodiode.

Pixel cell 200 also includes one or more optical isolation structures disposed in semiconductor material 228, such as for example optical isolation structures 220A and 220B, next to the storage transistor 208. As shown in the depicted example, optical isolation structures 220A and 220B are disposed in the semiconductor material 228 proximate to the storage transistor 208 to isolate a sidewall of the storage transistor 208 from parasitic stray light and/or stray charge in the semiconductor material 228 outside of the storage transistor 208 in accordance with the teachings of the present invention.

In one example, each optical isolation structure 220A and 220B is formed in semiconductor material 228 with deep trench optical isolation structures that are filled with tungsten 234. In one example, after deep trench isolation openings are formed in semiconductor material 208, and prior to filling the deep trench isolation openings with tungsten 234, a passivation layer 230 is formed on interior sidewalls of the deep trench isolation openings. In one example, the passivation layer 230 is a P+ passivation layer 230. In the example, after the passivation layer 230 is formed, a thin oxide 231 is formed on the interior sidewalls of the deep trench isolation openings over the passivation layer 230 as shown. A titanium nitride coating 232 is then formed on the interior sidewalls of the deep trench isolation openings over the thin oxide 231. In one example, the deep trench isolation openings are then filled with the tungsten 234 to form optical isolation structures 220A and 220B in accordance with the teachings of the present invention.

In one example, after the optical isolation structures 220A and 220B are filled with tungsten 234, chemical mechanical polishing (CMP) may be performed and then a protection layer 236 is formed over the optical isolation structures 220A and 220B. In one example, the protection layer 236 includes one of an oxide or a nitride, such as for example silicon nitride. The example shown in FIG. 2 also shows that vias including vias 246, 250, and 254, as well as metal conductors including metal conductors 244, 248, and 252 may be formed in an interlayer dielectric 284 proximate to front side 286 of the pixel cell 200. It is appreciated that the protection layer 236 over each optical isolation structure 220A and 220B protects the gate oxide 240 from being contaminated by the tungsten 234 of each optical isolation structure 220A and 220B in accordance with the teachings of the present invention.

In operation, each optical isolation structure 220A and 220B is an optically opaque isolation structure that blocks parasitic stray light and/or stray charge from entering the region of storage transistor 208 in semiconductor material 228. For instance, in an example in which pixel cell 200 is a front side illuminated pixel cell, FIG. 2 illustrates that stray light 222A entering front side 286 of semiconductor material 228 outside of storage transistor 208 is blocked by optical isolation structure 220A. Stray light 222B may enter semiconductor material 228 in areas outside of storage transistor 208, and consequently photogenerate electron hole pairs, including charge 226 as shown in FIG. 2. However, optical isolation structure 220A also blocks charge 226 from entering storage transistor 208 as shown.

The example depicted in FIG. 2 also illustrates that pixel cell 200 includes metal conductors and vias that are disposed in the interlayer dielectric 284 proximate to the front side 286 of semiconductor material 228. For instance, as shown in the illustrated example, metal conductors 244, 248, and 252 provide electrical connections through vias 246, 250 and 254 to the corresponding structures of the storage transistor 208, the $V_{GS}$ 224 coupling, and global shutter gate transistor 202 of pixel cell 200. It is appreciated that stray light may also be scattered by or deflected off of these structures. For instance, the example depicted in FIG. 2 shows that stray light 220C is deflected off of metal conductor 248 towards storage transistor 208, and that stray light 222D is deflected off of via 250 towards storage transistor 208. However, as shown, optical isolation structure 220B also blocks stray light 222C and 222D from entering storage transistor 208 in accordance with the teachings of the present invention.

Therefore, optical isolation structures 220A and 220B block stray light and/or stray charge from entering storage transistor 208 from surrounding areas in the semiconductor material 228 is in accordance with the teachings of the present invention. Indeed, no stray charges including photogenerated electron hole pairs can be generated in storage transistor 208. Accordingly, global shutter efficiency is improved in accordance with the teachings of the present invention.

In another example, it is appreciated that pixel cell 200 may be a backside illuminated pixel cell. In such an example it is appreciated that stray light may therefore enter semiconductor material 228 through a backside 288 of semiconductor material 228. In such an example, it is appreciated that a shield layer 238 may optionally be formed on the backside 288 of semiconductor material 228 over storage transistor 208 in accordance with the teachings of the present invention. As shown in the depicted example, stray light 222E is shielded by shield layer 238 from entering the backside 288 of semiconductor material 228 into storage transistor 208 in accordance with the teachings of the present invention. In one example, shield layer 238 may include a metal such as for example tungsten.

Figure 3:
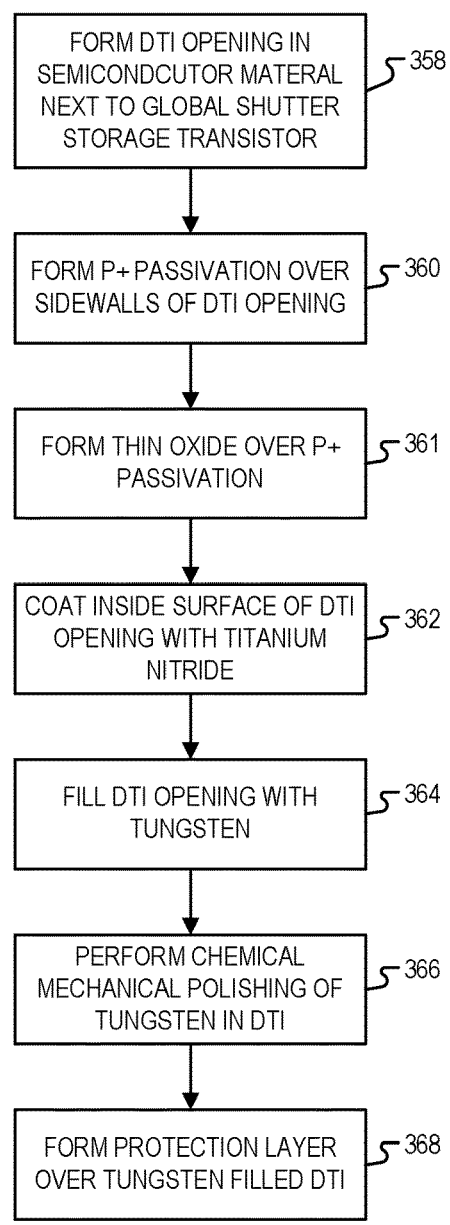
FIG. 3 is a flow chart illustrating an example process of fabricating isolation structures to isolate a global pixel storage structure in accordance with the teachings of the present invention.

FIG. 3 is a flow chart illustrating an example process 356 of fabricating optical isolation structures included in a pixel cell to isolate a global pixel storage node structure in accordance with the teachings of the present invention. For instance, in one example, it is appreciated that example process 356 may describe a process that may be used to fabricate pixel cell 100 of FIG. 1 and/or pixel cell 200 of FIG. 2, and that similarly named or numbered elements referenced below are coupled and function similar to as described above.

As shown in the example illustrated in FIG. 3, process block 358 shows that a deep trench isolation opening is formed in semiconductor material. In one example, the deep trench isolation opening is formed in the semiconductor material next to a global shutter storage transistor, or where the global shutter storage transistor will be formed in the semiconductor material. Process block 360 shows that a passivation is then formed over interior sidewalls of the deep trench isolation opening. In one example, the passivation is P+ passivation. Process block 360 shows that a thin oxide is then formed over the passivation, and process block 362 shows that the inside surface of the deep trench isolation opening is then coated with a nitride, such as titanium nitride, over the thin oxide. Process block 364 shows that the deep trench isolation opening is then filled with tungsten.

In one example, process block 366 shows that chemical mechanical polishing (CMP) may then be performed on the tungsten in the deep trench optical isolation structure. After the tungsten has been polished, process block 368 shows that a protection layer is then formed over the tungsten filled deep trench optical isolation structure. In one example, the protective layer includes one of an oxide or a nitride, such as silicon nitride.

Figure 4:
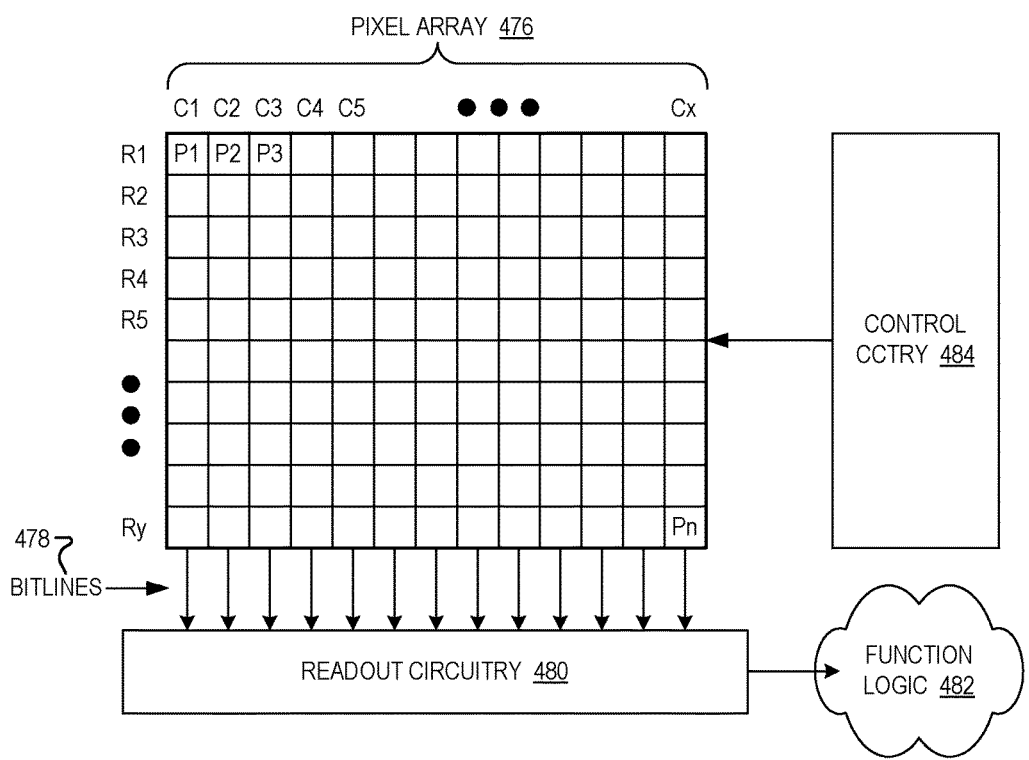
FIG. 4 is a diagram illustrating one example of an imaging system including a pixel array having pixel cells having isolated global pixel storage structures in accordance with the teachings of the present invention.

FIG. 4 is a diagram illustrating one example of an imaging system 474 including an example pixel array 476 having a plurality of image sensor pixels cells with isolated global pixel storage structures in accordance with the teachings of the present invention. As shown in the depicted example, imaging system 474 includes pixel array 476 coupled to control circuitry 484 and readout circuitry 480, which is coupled to function logic 482.

In one example, pixel array 476 is a two-dimensional (2D) array of image sensor pixel cells (e.g., pixels P1, P2, P3, . . . , Pn). It is noted that the pixel cells P1, P2, . . . Pn in the pixel array 476 may be examples of pixel cell 100 of FIG. 1 and/or of pixel cell 200 of FIG. 2 and/or the pixel cell fabricated in FIG. 3, and that similarly named and numbered elements referenced below are coupled and function similar to as described above. As illustrated, each pixel cell is arranged into a row (e.g., rows R1 to Ry) and a column (e.g., column C1 to Cx) to acquire image data of a person, place, object, etc., which can then be used to render a 2D image of the person, place, object, etc.

In one example, after each pixel cell P1, P2, P3, . . . , Pn has acquired its image data or image charge, the image data is readout by readout circuitry 480 through bitlines 478 and then transferred to function logic 482. In various examples, readout circuitry 480 may include amplification circuitry, analog-to-digital (ADC) conversion circuitry, or otherwise. Function logic 482 may simply store the image data or even manipulate the image data by applying post image effects (e.g., crop, rotate, remove red eye, adjust brightness, adjust contrast, or otherwise). In one example, readout circuitry 480 may readout a row of image data at a time along readout column lines (illustrated) or may readout the image data using a variety of other techniques (not illustrated), such as a serial readout or a full parallel readout of all pixels simultaneously.

In one example, control circuitry 484 is coupled to pixel array 476 to control operational characteristics of pixel array 476. In one example, control circuitry 484 is coupled to generate the global shutter signal and control signals discussed above for controlling image acquisition for each pixel cell. In the example, the global shutter signal and control signals simultaneously enable all pixels cells P1, P2, P3, . . . Pn within pixel array 476 to transfer the image charge from each respective photodiode during a single acquisition window.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An imaging system, comprising:
    a pixel array of pixel cells, wherein each one of the pixel cells includes:
        a photodiode disposed in a semiconductor material to accumulate image charge in response to incident light directed to the photodiode;
        a global shutter gate transistor, wherein a portion of the global shutter gate transistor is disposed in the semiconductor material and coupled to the photodiode to selectively deplete the image charge from the photodiode;
        a storage transistor, wherein a portion of the storage transistor is disposed in the semiconductor material to store the image charge; and
        an optical isolation structure disposed in the semiconductor material proximate to the storage transistor to isolate a sidewall of the storage transistor from stray light and stray charge in the semiconductor material outside of the storage transistor, wherein the optical isolation structure includes a deep trench isolation structure formed in the semiconductor material, wherein the deep trench isolation structure is filled with tungsten, wherein the optical isolation structure further includes a P+ passivation formed over an interior sidewall of the deep trench optical isolation structure between the tungsten and the semiconductor material;
    control circuitry coupled to the pixel array to control operation of the pixel array; and
    readout circuitry coupled to the pixel array to readout image data from the plurality of pixels.

2. The imaging system of claim 1 further comprising function logic coupled to the readout circuitry to store the image data from each one of the plurality of pixel cells.

3. The imaging system of claim 1 wherein the control circuitry is coupled to the pixel array to simultaneously enable all of the pixel cells in the pixel array to simultaneously transfer the image charge from each respective photodiode during a single acquisition window.

4. The imaging system of claim 1 wherein the optical isolation structure is one of a plurality of optical isolation structures disposed in the semiconductor material proximate to the storage transistor to isolate the sidewall of storage transistor from the stray light and the stray charge in the semiconductor material outside of the storage transistor.

5. The imaging system of claim 1 wherein each one of the pixel cells further comprises:
    a gate oxide layer disposed over the semiconductor material between a storage gate of the storage transistor and a storage region of the storage transistor in the semiconductor material; and
    a protection layer disposed over the optical isolation structure and proximate to the storage transistor to protect the gate oxide layer from being contaminated by the tungsten of the optical isolation structure, wherein the protection layer disposed over the optical isolation structure comprises one of an oxide or a nitride.

6. The imaging system of claim 1 wherein the optical isolation structure further comprises a thin oxide formed over the P+ passivation between the semiconductor material and the tungsten.

7. The imaging system of claim 6 wherein the optical isolation structure further comprises a titanium nitride coating formed over the thin oxide between the tungsten and the semiconductor material.

8. The imaging system of claim 1 wherein each one of the pixel cells further comprises a transfer transistor disposed in the semiconductor material and coupled between the photodiode and an input of the storage transistor to selectively transfer the image charge from the photodiode to the storage transistor.

9. The imaging system of claim 1 wherein each one of the pixel cells further comprises an output transistor disposed in the semiconductor material and coupled to an output of the storage transistor to selectively transfer the image charge from the storage transistor to a readout node.

10. The imaging system of claim 9 wherein the readout node comprises a floating diffusion disposed in the semiconductor material.

11. The imaging system of claim 9 wherein each one of the pixel cells further comprises:
    a reset transistor disposed in the semiconductor material and coupled to the readout node;
    an amplifier transistor disposed in the semiconductor material having an amplifier gate coupled to the readout node; and
    a row select transistor disposed in the semiconductor material coupled between a bitline and the amplifier transistor.

* * * * *